United States Patent [19]  [11] 4,193,080
Koike et al.  [45] Mar. 11, 1980

[54] NON-VOLATILE MEMORY DEVICE

[75] Inventors: Susumu Koike, Ibaraki; Ginjiro Kambara, Ashiya; Toshio Matsuda, Ootsu, all of Japan

[73] Assignee: Matsushita Electronics Corporation, Kadoma, Japan

[21] Appl. No.: 960,450

[22] Filed: Nov. 9, 1978

Related U.S. Application Data

[63] Continuation of Ser. No. 658,535, Feb. 17, 1976, abandoned.

[30] Foreign Application Priority Data

Feb. 20, 1975 [JP] Japan ................... 50/21636

[51] Int. Cl.² .................................. H01L 29/78
[52] U.S. Cl. .............................. 357/23; 357/54; 357/89
[58] Field of Search ................ 357/23, 89, 90, 54

[56] References Cited

U.S. PATENT DOCUMENTS 3,709,746  1/1973  DeWitt ..................... 357/89 X
3,853,496  12/1974  Kim .......................... 357/23 X
3,959,025  5/1976  Polinsky ..................... 357/23 X
3,986,903  10/1976  Watrous, Jr. ................ 357/23 X
4,011,576  3/1977  Uchida et al. .............. 357/23

OTHER PUBLICATIONS

A. Platt et al., "FET Fabrication", *IBM Technical Disclosure Bulletin*, vol. 14, No. 1, Jun. 1971, pp. 247-248.

*Primary Examiner*—James W. Davie
*Attorney, Agent, or Firm*—Cushman, Darby & Cushman

[57] ABSTRACT

The present invention provides a memory device of MNOS FET type wherein a high concentration part and a low concentration part contact each other in the source region and the drain region, and further, double layered insulation films under the gate electrode extending across the source region and drain region are made to contact only the lower concentration part, so that an acceptor impurity is prevented from mixing into the double layered insulation films from the source region and drain region, thus greatly improving the life (number of repeated uses) of the device.

4 Claims, 6 Drawing Figures

NON-VOLATILE MEMORY DEVICE

This is a continuation of application Ser. No. 658,535 filed Feb. 17, 1976, now abandoned.

BACKGROUND OF THE INVENTION

The present invention relates to a non-volatile memory device. The object is to improve and stabilize the characteristics of the device.

Recently, non-volatile semiconductor memory devices of MNOS (metal-nitride-oxide-semiconductor) structure have been actively studied and developed, some of which have already been in practical use. These memory devices are classified into two types according to working-principle. One type is avalanche-injection. Another is tunnel-injection. The former, although having merit in memory holding characteristics, has such shortcomings that the working voltage is higher, erasing is not easy and the number of repeated uses is not so large. On the other hand, the latter, although electrically easy with respect to erasing, is inferior to the former in memory holding characteristics, and the number of repeated uses for writing and erasing is less than $10^6$ times.

For both types, such shortcomings have been problems in practical use.

FIG. 1(a) shows the structure of a conventional non-volatile semiconductor memory device of the tunnel-injection type, which has an MNOS (metal-nitride-oxide-semiconductor) structure consisting of the source 1, the drain 2, a thin $SiO_2$ film 3 (thickness being about 20 Å) and an $Si_3N_4$ film 4 (thickness being 500 to 1,000 Å), the $SiO_2$ film 3 and the $Si_3N_4$ film 4 forming a double layered gate film. The structure, also, includes a substrate 5 made of n-type Si. Generally, this device is prepared in the following manner:

First, by a specified diffusion method, an acceptor is diffused into the n-type substrate 5 up to $10^{19}$ to $10^{20}$ atoms/cm$^3$ so as to form the source region 1 and the drain region 2. Second, a gate opening is formed in an $SiO_2$ film 6 by a known photo-etching method and the $SiO_2$ film 3 and the $Si_3N_4$ film 4 are grown in the gate opening. Then, and then the gate electrode 7, for instance, of Al film, is disposed on the film 4. Numerals 8 and 9 indicate the source electrode and the drain electrode, respectively. In this case, the gate opening is designed to partly expose the source region 1 and the drain region 2 therefrom, so that a part of the $SiO_2$ film 3 formed in the opening and a part of the source 1 and drain 2 overlap each other. FIG. 1(b) shows the overlapping part, namely, the part surrounded by a broken line part in FIG. 1(a), in an enlarged view. When a writing memory is formed without such overlapping, the amount of injection from the source region 1 becomes less, and therefore, the amount of memory extremely decreases.

The present inventors empirically confirmed that the existance of the overlapping part 10 affects both the memory holding characteristics and the number of repeated uses of the memory device in the following manner.

Surface concentration of the source and drain region in the overlapping part 10 usually goes as high as $10^{19}$ to $10^{20}$ atoms-cm$^{-3}$, and accordingly, the acceptor mixes into the $SiO_2$ film 3 through the overlapping part 10 during the time the film 3 is grown. Accordingly, the thin $SiO_2$ film 3 results in containing the acceptor, which acceptor affects the surface of the Si substrate 5 under the $SiO_2$ film 3. Namely, when a positive or negative voltage is impressed on the gate electrode 7 for writing or erasing in the memory device, a high electric field is impressed across the thin $SiO_2$ film 3. Consequently, the acceptor concentration in the $SiO_2$ film 3 varies, and further, the overlapping part suffers a high strain due to a high surface concentration of the source and drain, and hence the insulation of the thin $SiO_2$ film 3 becomes poor. Accordingly, when positive or negative voltage is repeatedly impressed, the insulation of the $SiO_2$ film 3 extremely decreases. As a result, electric charges captured at a deep trap level on the interface between the $SiO_2$ film 3 and the $Si_3N_4$ film 4 are discharged to the side of the Si substrate through the $SiO_2$ film 3, thereby decreasing the memory holding time characteristics.

As mentioned above, decrease of both the memory holding characteristics and the number of repeated uses of devices having such structure as shown in FIG. 1, may occasionally be due to the decrease of insulation in the $Si_3N_4$ film 4, but is mostly caused by the decrease of insulation in the thin $SiO_2$ film 3. That is because the acceptor mixes into the film 3 from the source region 1 and drain region 2.

SUMMARY OF INVENTION

The present invention purports to solve the above-mentioned problems with non-volatile semiconductor memory devices by improving memory holding characteristics and the number of repeated uses of the devices.

DETAILED DESCRIPTION OF THE INVENTION

Figure 2A:
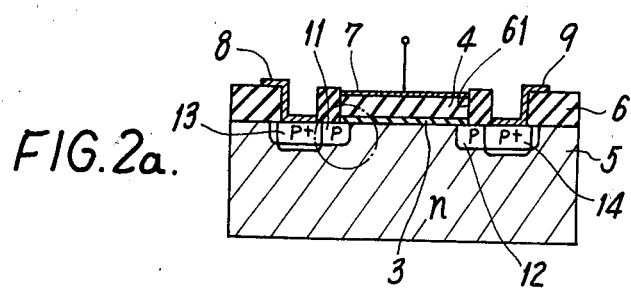
FIG. 2(a) is a sectional view of an embodiment for a non-volatile memory device of this invention.

The present invention relates to a structure and method of making a non-volatile memory device, which, on the basis of the abovementioned facts, is improved to keep the $SiO_2$ film clean from contamination by acceptor mixing therein. As an embodiment of this invention, a non-volatile memory device with a basic structure is shown in FIG. 2(a). The device comprises an n-type Si substrate 5, an insulation film 6 on the sustrate 5, a source region 11 and a drain region 12 formed on the principal face of the substrate 5 as low concentration p-type regions, another source region 13 and drain region 14 formed as smaller and higher concentration regions of $p^+$-type in the regions 11 and 12, respectively, a thin SiO$_2$ film 3 contacting the surface of the substrate exposed in the opening 61, an Si$_3$N$_4$ film 4 formed on the SiO$_2$ film 3, and the gate electrode 7 formed on the Si$_3$N$_4$ film 4, and the source and the drain electrodes 8 and 9 formed to contact high concentration regions 13 and 14, respectively.

The structure of the device in FIG. 2 is characterized in that the source region 11 and drain region 12 of p-type diffused regions of lower concentration are disposed with a specified distance inbetween on the principle face of substrate 5, and moreover, higher concentration regions 13 and 14 of p$^+$-type diffused regions are formed so as to contact the abovementioned lower concentration regions 11 and 12, respectively.

The process of making the abovementioned structure of the present device is different from the conventional structure as follows:

Additional p-type diffused regions 11 and 12 of lower concentration (approximately $10^{16}$ to $10^{17}$ atoms/cm$^3$) than the p$^+$-type regions 13 and 14 (approximately $10^{19}$ to $10^{20}$ atoms/cm$^3$) are formed as a source and a drain, respectively, in the n-type substrate 5. Since the regions 11 and 12 are of lower concentration, the resistance of the regions is high and also the injection efficiency is low. In order to keep off such shortcomings, electrode contacting regions 13, 14 of higher concentrations are made by forming an opening on the insulation film 6 either within or so as to partly contact the surface part of the source region 11 and the drain region 12. And then, from this opening, an acceptor is diffused to form the diffused regions 13 and 14 of surface concentration of $10^{19}$ to $10^{20}$ atoms/cm$^3$. Then the gate opening 61 is formed so as to expose the low concentration regions 11 and 12 and the surface of the substrate between these regions, but not to expose the high concentration regions 13 and 14. It is sufficient that at least a part of the lower concentration regions 11 and 12 are exposed from the gate opening 61.

Figure 2B:
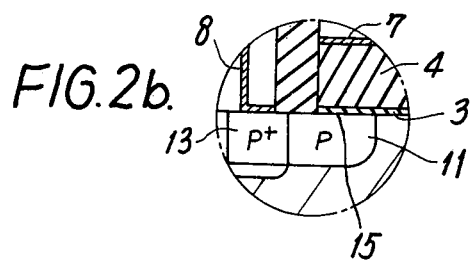
FIG. 2(b) is an enlarged view of the part surrounded by the broken line in the above FIG. 2(a)

FIG. 2(b) is an enlarged view of the part surrounded by the broken line in FIG. 2. Then, the SiO$_2$ film 3 of very thin cross-section, such as, 20 Å, and the Si$_3$N$_4$ film 4 are formed in the gate opening 61. Therefore, end parts of the films 3 and the surface part 15 of the low concentration regions 11 and 12 overlap to each other. The part 15 is obviously of lower concentration according to this structure and process. Therefore, the acceptor hardly mixes into the SiO$_2$ film 3, and the strain in the overlapping part decreases. Thus, the SiO$_2$ film 3 becomes superior in insulation.

Experiments by the present inventors indicate that both the memory holding characteristics against time lapse and the threshold voltages required for memorizing against the number of repeated uses of the device are much improved as described below. The structure and process likewise have an effect on any non-volatile semiconductor memory devices having a double layered gate insulation film structure but with other kinds of insulating films. Further, the structure and process have an excellent effect on avalanche-injection type memory devices having an MNOS structure other than of the aforementioned tunnel-injection type, in stabilizing the characteristics thereof.

An example of making the device of FIG. 2 of the present invention is described in detail in the following.

First, n-type Si (100) crystal with impurity concentration of $10^{15}$ cm$^{-3}$ is employed for the substrate 5. The SiO$_2$ insulating film 6 with thickness of 6000 Å is formed on the substrate 5 by a wet thermal oxidation technique.

Then, openings for the source and the drain regions are formed in the SiO$_2$ film 6 by a known photo-etching method.

Secondly, boron is diffused at lower concentration to form the regions 11 and 12. Namely, for the boron-diffusion, boron-doped SiO$_2$ film is formed in thickness of 4,000 to 5,000 Å on the substrate 5 by oxidation reaction between silane SiH$_4$ and diborane B$_2$H$_6$ (the ratio is 25:0.0015, temperature is 400° C.): The diffusion is conducted with the temperature at 1,180° C., in mixed gas of flowing nitrogen gas at 1 l/min., and of flowing oxygen gas at 1 l/min. and for the period of 30 minutes. Consequently, the boron in the boron-doped SiO$_2$ film diffuses into the substrate to form the p-type source region 11 and the p-type drain region 12 with surface concentration of $5 \times 10^{16}$ to $10^{17}$ cm$^{-3}$ and junction depth of about 1μ. For said concentration range, both the contamination-free and injection efficiency are found to work consistently.

Thirdly, a smaller opening is formed on the mask 6 within the part of the source region 11 and the drain region 12 of lower concentration in order to form the high concentration regions 13 and 14 by diffusing therefrom.

The source 13 and drain 14 are formed by coating a boron-doped SiO$_2$ film on the substrate, followed by thermal diffusion in the flowing nitrogen gas (1 l/min.) at 1,150° C. for 40 min. The boron-doped SiO$_2$ film is prepared by an oxidation reaction between silane and diborane (the ratio is 13.5 to 0.45) at 400° C. Consequently, the p$^+$-type source electrode region 13 and the p$^+$-type drain electrode region 14 with surface concentration of $6 \times 10^{19}$ cm$^{-3}$ and junction depth of 1.6 to 1.8μ are obtainable.

Fourthly, the gate opening 61 is formed, in a manner not to expose the regions 13 and 14 therefrom, and to expose only the regions 11, 12 and the substrate face inbetween therefrom. Then, the SiO$_2$ thin film 3 is formed in the opening 61 by thermal oxidation of the Si substrate surface in the flowing dry oxygen gas of 80 cc/min. at 500° C. Thereby, the thickness of said SiO$_2$ film 3 becomes 30 to 100 Å in 30 to 90 min. growth time. Next, the Si$_3$N$_4$ film 4 is grown in the flowing SiH$_4$ gas of 30 ml/min. and NH$_3$ gas of 2.0 l/min. The thickness of said Si$_3$N$_4$ film 4 becomes 300 to 1,500 Å at 600° to 700° C. in 5 to 25 min. growth time. Subsequently, the openings for the source, the drain and the gate electrodes are formed in the oxide film 6 by a known method, and aluminum films 8, 9 and 7 are deposited in said openings as electrodes.

Figure 1A:
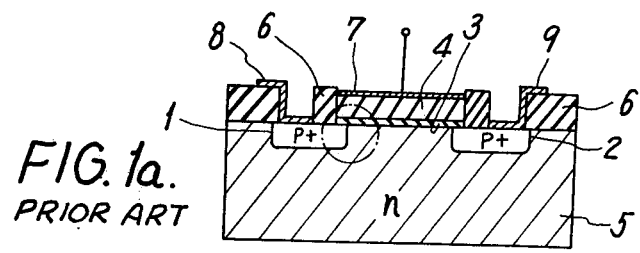
FIG. 1(a) is a sectional view of the structure of a conventional non-volatile memory device.
Figure 1B:
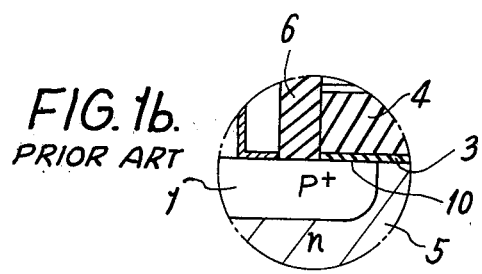
FIG. 1(b) is an enlarged view of the part surrounded by the broken line in the above FIG. 1(a)
Figure 3:
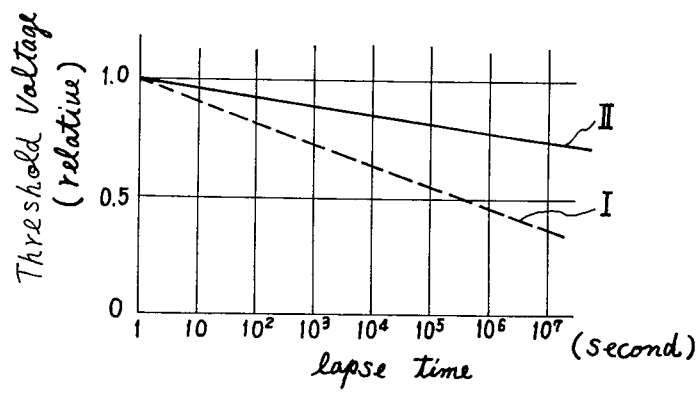
FIG. 3 is a chart for comparing the memory-holding characteristic of the device of FIG. 1 (prior art) with the device of FIG. 2, wherein the abscissa indicates lapse time from memorization and the ordinate indicates the change of the threshold voltage (relative value) which responds to the amount of stored charges.

FIG. 3 shows a comparison of memorized voltage holding performances between the conventional memory device of FIG. 1 and the example of memory device of FIG. 2 of the present invention. The ordinate indicates the change of the threshold voltage (relative value) which responds to, hence representing, stored charges, and the abscissa indicates lapse time from the memorizing. In the chart solid curve II indicates the characteristic of the present invention, and the dotted curve I indicates that of the conventional device.

Figure 4:
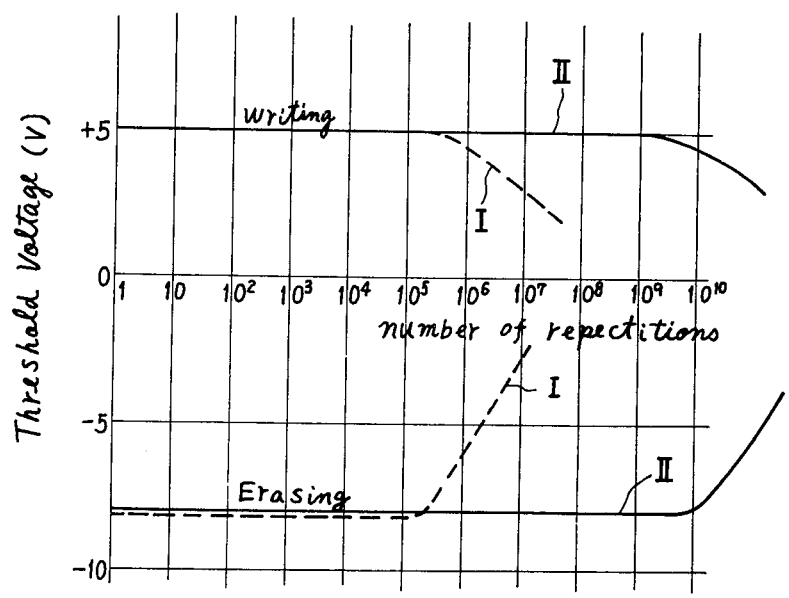
FIG. 4 is a chart for comparing the characteristics of the number of repeated uses for writing and erasing of the device of FIG. 1 with the device of FIG. 2, wherein the abscissa indicates the number of repetitions and the ordinate indicates the threshold voltage.

FIG. 4 shows a comparison of the threshold voltages required for memorizing between the conventional memory device of FIG. 1 and the example of memory device of FIG. 2 of this invention. The ordinate indicates threshold voltages responding to stored charges and the abscissa indicates number of repeated uses. In the chart solid curves II for the device of the present invention show higher durability in holding constant threshold voltages, while the dotted curves I for the conventional device show lower durability.

What is claimed is

1. A non-volatile memory device comprising:
   a semiconductor substrate of a first conductivity type;
   a source region and a drain region which are formed having a predetermined space between each other in said semi-conductor substrate, each region having a second conductivity type opposite to said first conductivity type;
   a first gate insulating layer formed on said substrate and having a uniform and very small thickness, said first gate insulating layer extending between said source region and said drain region;
   a second gate insulating layer formed on and coextensive with said first gate insulating layer and being substantially thicker than said first insulating layer;
   a gate electrode formed on said second gate insulating layer;
   a source electrode formed to make ohmic contact with said source region;
   a drain electrode formed to make ohmic contact with said drain region;
   said substrate further comprising:
   a first region extending from said source region toward said drain region and having said second conductivity type and a lower impurity concentration than said source region;
   a second region extending from said drain region toward said source region and having said second conductivity type and a lower impurity concentration than said drain region, said first gate insulating layer having peripheral edges on at least one part of said first extended region and on at least one part of said second extended region, but not on said source region and said drain region.

2. The non-volatile memory device of claim 1 wherein said first gate insulating layer comprises a $SiO_2$ film.

3. The non-volatile memory device of claim 1 wherein said first gate insulating layer comprises an $SiO_2$ film formed on said substrate and said second gate insulating layer comprises an $Si_3N_4$ film formed on said $SiO_2$ film.

4. A non-volatile memory device comprising:
   a semi-conductor substrate of one conductivity type;
   a source region and drain region of opposite conductivity formed in said substrate, said source region being a predetermined distance from said drain region, the portion of said semiconductor substrate between said source and drain regions including a gate region, a double-layered gate insulating film formed on said gate region and comprising an $SiO_2$ film formed on the surface of said substrate and an insulating film of $Si_3N_4$ formed on and coextensive with said $SiO_2$ film, said $Si_3N_4$ film being thicker than said $SiO_2$ film, each of the source and drain regions having a higher impurity concentration portion and a lower impurity concentration portion, said double-layered gate insulation film being formed on said lower impurity concentration portions and on the area of said semi-conductor substrate between said lower impurity concentration portions of said source and drain regions.

* * * * *